(12) United States Patent
Wedeen

(10) Patent No.: US 7,511,494 B2
(45) Date of Patent: Mar. 31, 2009

(54) METHOD FOR MEASURING THE MICROARCHITECTURE OF COMPLEX TISSUE WITH MRI

(75) Inventor: Van J. Wedeen, Somerville, MA (US)

(73) Assignee: The General Hospital Corporation, Boston, MA (US)

(*) Notice: Subject to any disclaimer, the term of this patent is extended or adjusted under 35 U.S.C. 154(b) by 0 days.

(21) Appl. No.: 11/747,479

(22) Filed: May 11, 2007

(65) Prior Publication Data

US 2008/0024131 A1 Jan. 31, 2008

Related U.S. Application Data

(60) Provisional application No. 60/799,617, filed on May 11, 2006.

(51) Int. Cl.
*G01V 3/00* (2006.01)
(52) U.S. Cl. ...................................... 324/309; 324/307
(58) Field of Classification Search .................. 324/307, 324/309
See application file for complete search history.

(56) References Cited

U.S. PATENT DOCUMENTS 5,833,609 A * 11/1998 Dannels et al. ............. 600/410
6,526,305 B1 * 2/2003 Mori ........................... 600/410
2005/0277825 A1 12/2005 Wong et al.

OTHER PUBLICATIONS

Wong et al; Optimized Isotropic Diffusion Weighting; MRM 34:139-143 (1995).

* cited by examiner

*Primary Examiner*—Diego Gutierrez
*Assistant Examiner*—Megann E Vaughn
(74) *Attorney, Agent, or Firm*—Quarles & Brady LLP

(57) ABSTRACT

A diffusion-weighted MRI pulse sequence employs a two-dimensional diffusion weighting gradient that is sensitive to spin diffusion in a plane defined by two orthogonal gradients to acquire an image. The resulting magnitude image indicates the location of neuronal fibers perpendicular to this plane and by repeating the acquisition with the plane oriented at different angles, neuronal fibers extending through the field of view at any angle are detected. The magnitude images are used to produce a fiber tracking image.

6 Claims, 5 Drawing Sheets

METHOD FOR MEASURING THE MICROARCHITECTURE OF COMPLEX TISSUE WITH MRI

CROSS REFERENCE TO RELATED APPLICATION

This application claims the benefit of U.S. Provisional Application No. 60/799,617 filed on May 11, 2006 and entitled "Method for Measuring the Microarchitecture of Complex Tissue with MRI".

BACKGROUND OF THE INVENTION

The field of the invention is nuclear magnetic resonance imaging (MRI) methods and systems. More particularly, the invention relates to MR imaging of the brain.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

There are many MR imaging techniques used to acquire diagnostic information from the brain. These include contrast enhanced $T_1$-weighted images that brightly reveal regions where the blood-brain barrier is destroyed, $T_2$-weighted fast-spin-echo (FSE) and fluid attenuated inversion-recovery (FLAIR) imaging which show the extent of edema surrounding a damaged region. Two of the most important diagnostic tools, however, are diffusion-weighted imaging (DWI) and perfusion-weighted imaging (PWI) which measure physiological parameters that correlate with tissue health.

Diffusion-weighted imaging (DWI) is a powerful MRI technique for probing microscopic tissue structure. In DWI, a pulse sequence is employed which contains a magnetic field gradient known as a diffusion gradient that sensitizes the MR signal to spin motion. In a DWI pulse sequence the detected MR signal intensity decreases with the speed of water diffusion in a given volume of tissue. The first moment of this diffusion gradient, also known as the "b-value" determines the speed of diffusion to which the image is sensitive. This b-value may be adjusted by either varying the area of the two lobes of the diffusion magnetic field gradient, or by varying the time interval between them. When water motion in the subject is unrestricted, the MR signal intensity at the center of the echo using a spin-echo diffusion-weighted pulse sequence is related to the b-value as follows:

$$A = \frac{S(b)}{S_0} = e^{-bD} \qquad (1)$$

where the "b-value" $b = \gamma^2 G^2 \delta^2 (\Delta - \delta/3)$. The parameter $\gamma$ is the gyromagnetic ratio and G is the amplitude of the applied diffusion magnetic field gradients. S(b) is the MR signal magnitude with diffusion weighting b, and $S_0$ is the MR signal magnitude with no diffusion weighting (b=0). The parameter D is the diffusion coefficient of the fluid (in $mm^2/s$), which directly reflects the fluid viscosity where there are no structural restrictions to diffusion of the water. $\Delta$ is the time interval between the onsets of the two diffusion gradient lobes and $\delta$ is the duration of each gradient lobe. The diffusion coefficient D in equation (1) may be calculated, since b is known and the attenuation A can be measured.

Nerve tissue in human beings and other mammals includes neurons with elongated axonal portions arranged to form neural fibers or fiber bundles along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research activities on brain functioning can benefit from non-invasive imaging and tracking of the axonal fibers and fiber bundles. In particular, diffusion tensor magnetic resonance imaging (DTI) such as that disclosed in U.S. Pat. Nos. 6,526,305; 6,642,7126 and 6,806,705 has been shown to provide image contrast that correlates with axonal fiber bundles. In the DTI technique, motion sensitizing magnetic field gradients are applied in a diffusion weighted imaging (DWI) pulse sequence so that the magnetic resonance images include contrast related to the diffusion of water or other fluid molecules. By applying the diffusion gradients in selected directions during the excitation/imaging sequence, diffusion weighted images are acquired from which apparent diffusion tensor coefficients are obtained for each voxel location in image space. From this tensor the dominant direction of spin diffusion in each voxel can be determined.

Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles. Using iterative tracking methods, axonal fibers or fiber bundles can be tracked or segmented using the DTI data as described in U.S. Pat. No. 6,526,305.

To calculate the apparent diffusion tensor coefficients, it is necessary to acquire at least six DWI images using motion-sensitizing gradients directed in six different directions. Using the DTI method of measuring anisotropy in each image voxel will indicate a single direction that corresponds to a single neuronal fiber. This method is very limited in its ability to track neuronal fibers that cross each other in an image voxel.

Diffusion sensitive imagery (DSI) is a method for analyzing DWI images to determine the diffusion directions in each image voxel. As described in U.S. Pat. Nos. 6,614,226 and 7,034,531, by acquiring more DWI images at different directions and gradient b values, it is possible to produce an image that indicates multiple diffusion directions in each image voxel. When a fiber tracking method is used with such a DSI image, neuronal fibers that cross each other can more accurately be detected and displayed.

SUMMARY OF THE INVENTION

The present invention is a new method and system for acquiring diffusion weighted images and for producing fiber tracks from such images. The diffusion weighted images are acquired using a two-dimensional DWI gradient which is sensitive to spin diffusion in a two-dimensional plane. Locations in the reconstructed DWI image where the signal magnitude is maximum are locations where there is no diffusion in the 2D plane and these locations correspond to fiber tracks oriented perpendicular to the 2D plane. By acquiring a series of such DWI images with the 2D DWI gradient plane rotated to different directions and/or b values, the location of fiber tracks throughout a region of interest can be determined and imaged.

An object of the invention is to reduce the data processing required to produce fiber tracking images from acquired DWI data. By using a 2D DWI gradient, both the location and direction of axonal fibers may be determined directly from the reconstructed magnitude images.

DESCRIPTION OF THE PREFERRED EMBODIMENT

Figure 1:
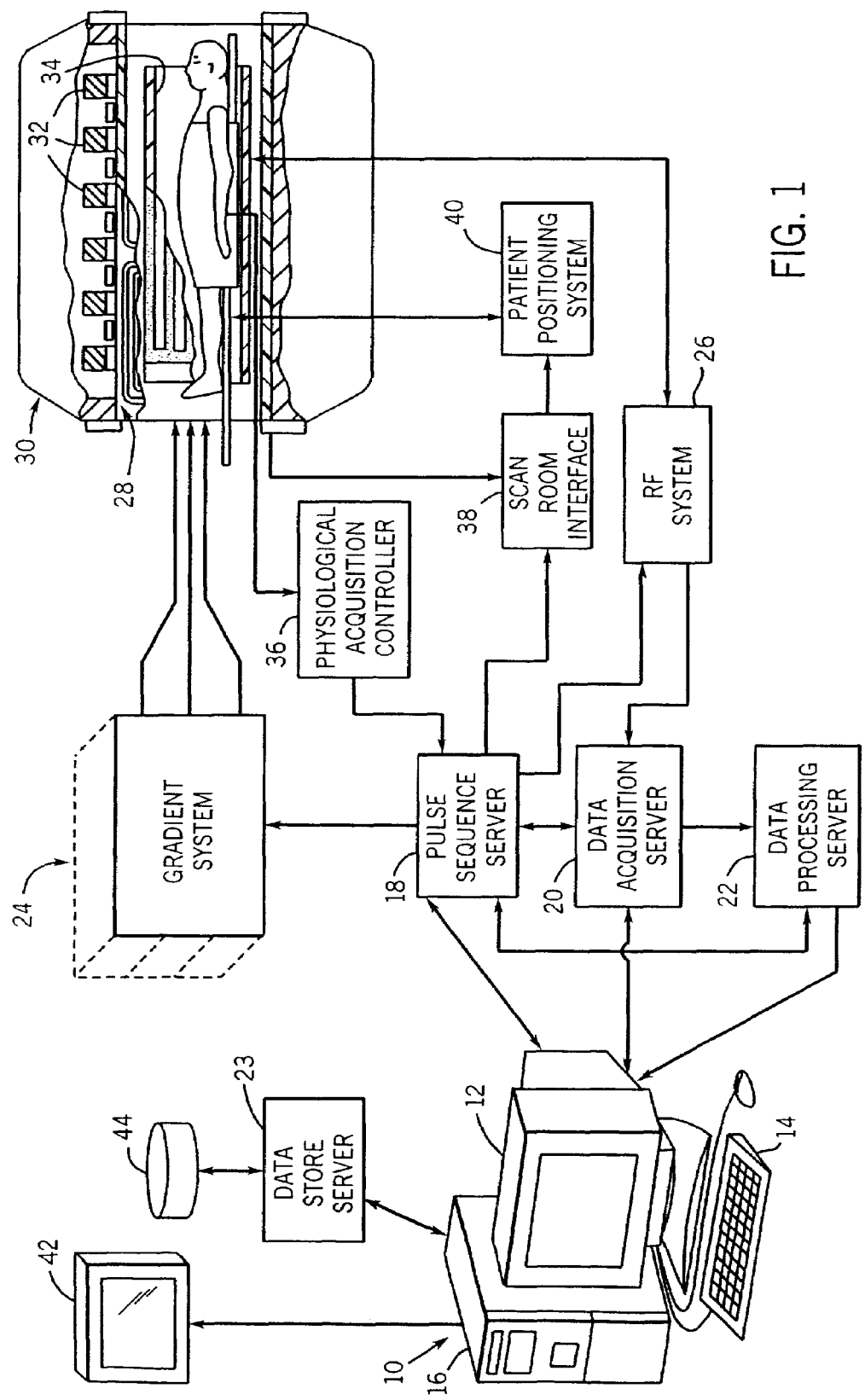
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses are applied to the whole body RF coil 34.

The RF system 26 also includes one or more RF receiver channels. The RF receiver channel is connected to a receive coil, which in the preferred embodiment is a head coil. The signal from the head coil is coupled to an RF amplifier that amplifies the NMR signal received by the coil, and a quadrature detector and analog-to-digital converter detects and digitizes the I and Q quadrature components of the received NMR signal. The magnitude of the received NMR signal may thus be determined at any sampled "k-space" point by the square root of the sum of the squares of the I and Q components:

$$M=\sqrt{I^2+Q^2}, \quad (3)$$

and the phase of the received NMR signal may also be determined:

$$\phi=\tan^{-1}Q/I. \quad (4)$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
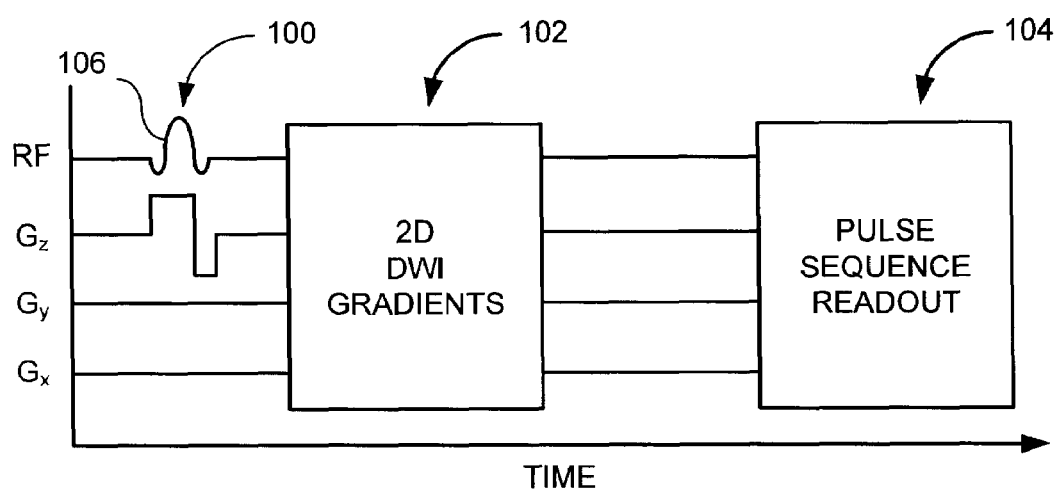
FIG. 2 is a graphic representation of a pulse sequence which employs a 2D DWI gradient in accordance with the present invention.

Referring particularly to FIG. 2, the present invention is practiced with an MRI system operated under the direction of a pulse sequence that acquires MRI data from which an image is reconstructed. The pulse sequence includes a spin excitation section 100, a 2D DWI gradient section 102 and an pulse sequence readout section 104. The excitation section 100 includes an rf excitation pulse 106 that produces transverse spin magnetization, the 2D DWI gradients section 102 includes diffusion sensitizing gradient waveforms which will be described in detail below, and the pulse sequence readout section 104 includes one or more readout gradients and phase encoding gradients that position encode the transverse magnetization prior to readout of one or more NMR signals. In a preferred embodiment the excitation section 100 and pulse sequence readout section 104 form a 2D, single shot EPI pulse sequence.

The present invention is not limited to any particular imaging pulse sequence and many alternatives are possible. In addition to using 3D image pulse sequences using radial or spiral k-space sampling trajectories, for example, it is also possible to employ the 2D DWI gradient section 102 in a preparation pulse sequence performed prior to the imaging pulse sequence. Such an embodiment is disclosed in U.S. Pat. No. 6,078,176, where the DWI gradients are applied in a preparatory pulse sequence prior to the performance of a fast spin-echo (FSE) imaging pulse sequence. With this embodiment the preparatory pulse sequence employs an rf excitation pulse to produce transverse magnetization and then the 2D DWI gradient section 102 is performed to diffusion weight the magnetization for in plane motion. Another rf pulse is then applied to tip the spin magnetization back up to the longitudinal axis and the resulting diffusion weighted longitudinal magnetization $M_z$ is then subjected to the imaging pulse sequence that follows.

Figure 3A:
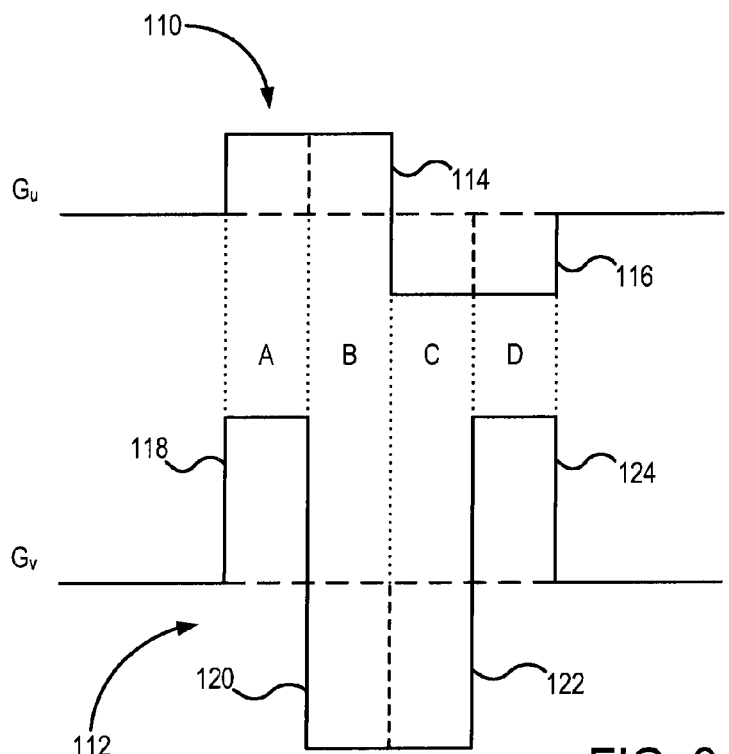
FIG. 3A is a graphic representation of a preferred embodiment of a 2D DWI gradient waveform.
Figure 3B:
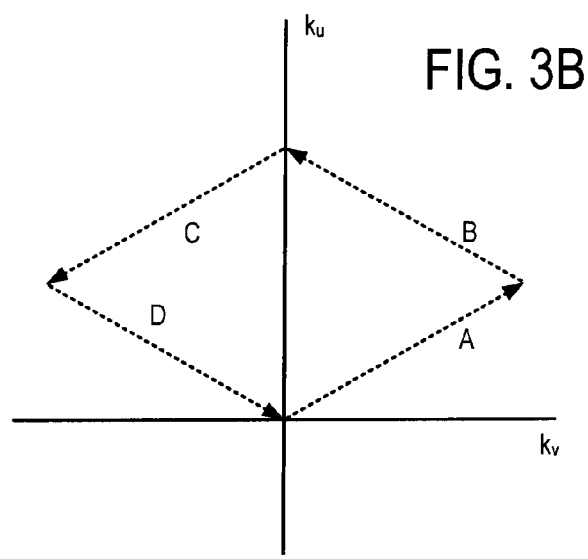
FIG. 3B is a graphic representation of the k-space diffusion sensitizing trajectory of the gradient waveform of FIG. 3A.

Referring particularly to FIGS. 3A and 3B, the 2D DWI gradient section 102 includes two orthogonal diffusion weighting gradient waveforms 110 and 112. These are produced by a gradient $G_u$ and a gradient $G_v$, which are directed along respective axes u and v. The gradients $G_u$ and $G_v$ are produced with combinations of the $G_x$, $G_y$ and $G_z$ gradients generated by the MRI system. As will become apparent from the discussion below, the 2D plane which the two axes u and v define is rotated to many different directions during the scan.

The first gradient $G_u$ 110 is a bipolar gradient having a first lobe 114 of one polarity and a second lobe 116 of the opposite polarity. The lobes 114 and 116 are of equal size and the $G_u$ gradient 110 is similar to a typical "one-dimensional" DWI gradient having a diffusion weighting value b determined as described above.

The second gradient $G_v$ 112 can be viewed as two bipolar diffusion weighted gradients of opposite polarity. The first bipolar gradient $G_v$ includes a gradient lobe 118 and an opposite, but equal sized gradient lobe 120. The second bipolar gradient is comprised of negative gradient lobe 122 and an opposite, but equal size gradient lobe 124. Because the areas of gradient lobes 118, 120, 122 and 124 are the same as the areas of gradient lobes 114 and 116 in the first gradient $G_u$ 110 and the time durations of the two gradient waveforms 110 and 112 are the same, the diffusion weighing b values of the two gradient waveforms 110 and 112 are also the same. The integral of both gradients $G_u$ and $G_v$ is zero.

The 2D DWI gradient section 102 sensitizes transverse magnetization for diffusion in any direction in the plane defined by the $G_u$ gradient 110 and the $G_v$ gradient 112. This 2D diffusion sensitivity is shown by the diffusion weighting k-space trajectory shown in FIG. 3B. Referring particularly to FIGS. 3A and 3B, during a first period A of the 2D DWI gradient the diffusion sensitivity tracks along a vector A in the positive $k_u$, $k_v$ quadrant from the origin of k-space ($k_u$=0, $k_v$=0). During a second period B, the diffusion sensitivity traverses a trajectory in k-space indicated by vector B back to $k_u$=0, and during a third period C, the diffusion sensitivity traverses a trajectory indicated by vector C. During a fourth period D the diffusion sensitivity traverses a trajectory D back to the origin of k-space.

Figure 4:
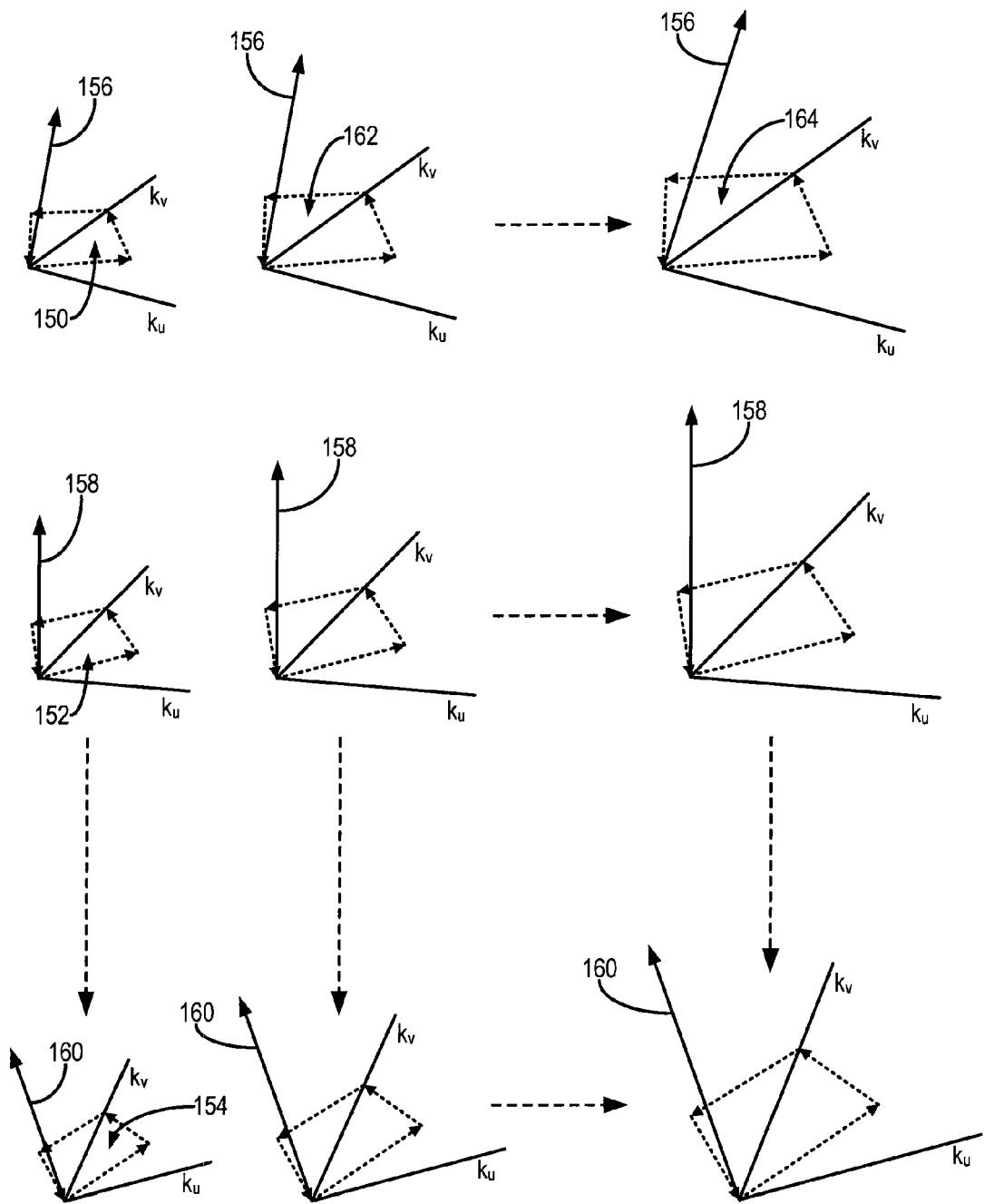
FIG. 4 is a graphic representation of the k-space diffusion sensitizing trajectory for different 2D plane orientations and different b values.

Referring particularly to FIG. 4, the 2D DWI gradients are changed during a scan to detect neuronic fibers disposed at any angle within the image field of view. More specifically, a 2D DWI image is acquired with the 2D DWI gradients in a plane indicated at 150, and this plane is rotated through many angles as indicated at 152 and 154. The acquired images then indicate the presence of neuronic fiber tracks at angles indicated by the respective orthogonal vectors 156, 158 and 160.

In addition to acquiring 2D DWI images at a set of different angles, the repetitions may also be performed in which the diffusion value b is changed. Referring again to FIG. 4, the b value of the 2D DWI gradients may be changed to increase the area enclosed by the diffusion weighting k-space trajectory as shown at 162. A set of images is acquired with this diffusion b value at the same angles as before. This is repeated for many diffusion b values until the images are acquired at each angle for the largest prescribed diffusion b value as indicated at 164.

Figure 5:
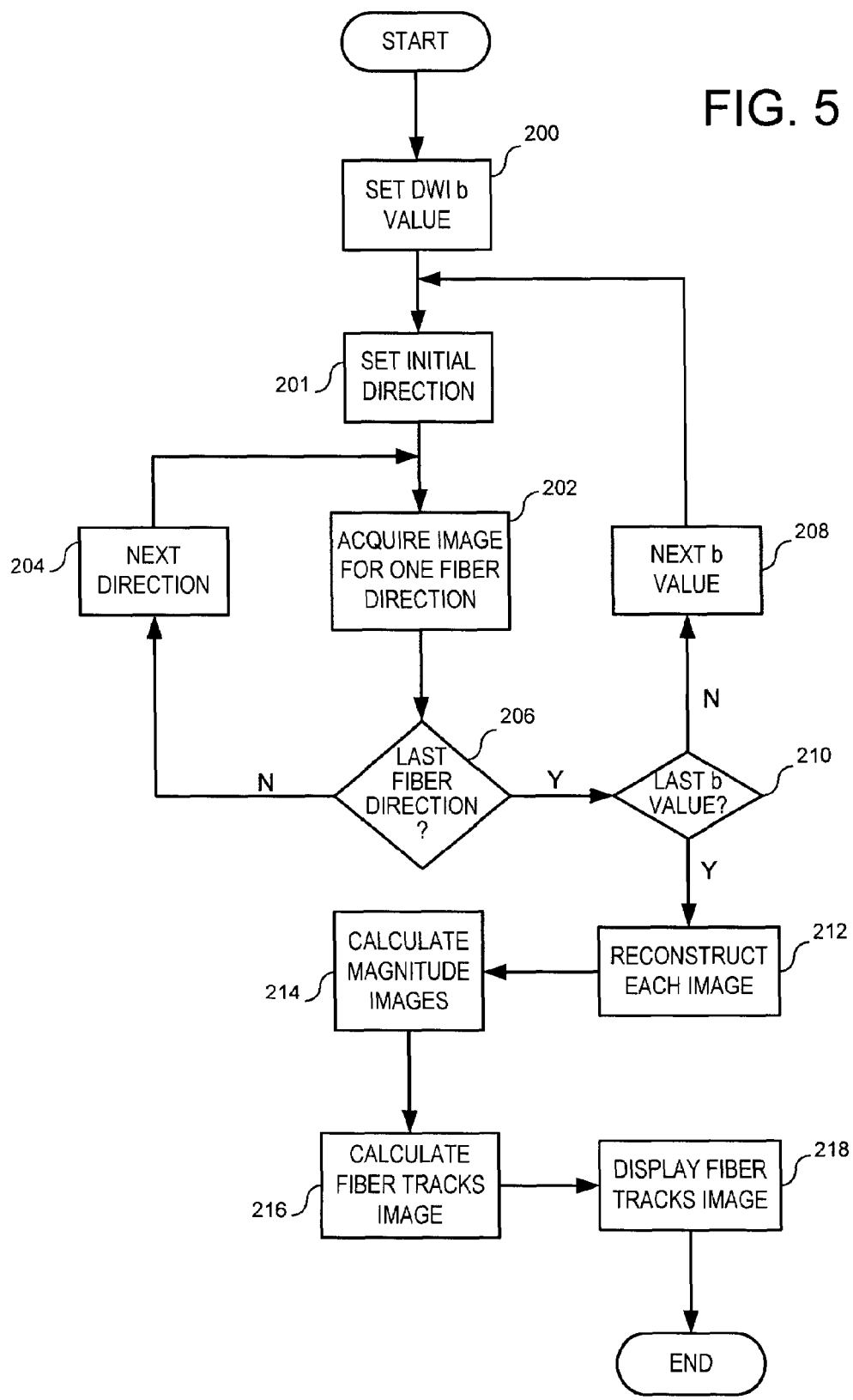
FIG. 5 is a flow chart of the steps used to acquire the 2D DWI data and produce a fiber track image therefrom.

Referring particularly to FIG. 5, the above 2D DWI pulse sequence is used during a scan on the MRI system to acquire sufficient diffusion weighted data to reconstruct a fiber tracks image. As indicated at process blocks 200 and 201, the first step is to set the gradients in the 2D DWI so that they lie in an initial plane orientation and have an initial diffusion b value. As indicated at process block 202, the MRI system is then operated under the above-described pulse sequence to acquire a 2D DWI image for one fiber track direction and diffusion b value.

The 2D DWI pulse sequence is then repeated at the next prescribed fiber direction as indicated at process block 204. This continues until images have been acquired at this initial diffusion b value for all prescribed fiber directions as determined at decision block 206. After all directions have been acquired the process repeats at the next prescribed diffusion b value as indicated at process block 208. This continues until images have been acquired at all of the prescribed diffusion b values as determined at decision block 210. It should be apparent that the order in which all the 2D DWI images are acquired can be switched such that all the diffusion b values are acquired at each fiber track angle until all the angles are acquired. The specific number of angles and the number of different b values acquired will depend on the particular clinical application. As a general rule, the 2D DWI measurement performed by the present invention can replace the conventional 1D DWI measurements used in prior methods such as the DTI, DSI and Q-ball methods described in the above-cited patents.

After all the 2D DWI images are acquired, each k-space data set is used to reconstruct an image as indicated at process block 212. If a 2D FT imaging pulse sequence is employed as described above, the image is reconstructed by performing a two-dimensional, complex fast Fourier transformation of the acquired k-space data set. The signal magnitude at each image voxel is then calculated at process block 214 as indicated above in equation (3). Other image reconstruction methods may be used and the choice will depend primarily on the type of imaging pulse sequence that is employed to acquire the data.

The next step in the process is to calculate the fiber tracks in the field of view of the image as indicated at process block 216. Unlike prior DTI and DSI methods no complex calculations or transformations are needed since the NMR signal magnitudes associated with each image voxel are also associated with a fiber direction. A high magnitude signal at a particular fiber direction indicates a fiber track passing through the image voxel with that direction and the fiber tracks are formed in the image by connecting together adjacent image voxels demonstrating fibers present at similar fiber angles. The method disclosed in U.S. Pat. No. 6,526,305 may be used to connect voxels to form fiber tracks in the image.

As indicated at process block 218, the calculated fiber track image may then be displayed or saved for later use. As with DSI, this method is not limited to calculating a tensor which has a sensitivity to only one fiber track direction at each image voxel. Multiple neuronic fibers may pass through a voxel and this will be seen as increases in the signal magnitude at each of the corresponding fiber angles.

I claim:

1. A method for producing an image of a subject with a magnetic resonance imaging (MRI) system, the steps comprising:
   a) applying an rf excitation field to the subject to produce transverse magnetization therein;
   b) applying a two-dimensional diffusion weighting gradient to the transverse magnetization, the two-dimensional diffusion weighting gradient including:
      i) a first orthogonal gradient produced by a first gradient waveform whose integral is substantially zero; and
      ii) a second orthogonal gradient that is orthogonal to the first orthogonal gradient and produced by a second gradient waveform whose integral is substantially zero;
      wherein the first and second gradient waveforms sensitize the transverse magnetization to diffusion in at least a two-dimensional plane;
   c) acquiring NMR signals produced by the sensitized transverse magnetization;
   d) reconstructing an image with the acquired NMR signals; and
   e) calculating the magnitude of the NMR signal at each of a plurality of voxels in the reconstructed image to produce a magnitude image.

2. The method as recited in claim 1 which includes:
   f) repeating steps a) through e) a plurality of times, each repetition employing a different two-dimensional diffusion weighting gradient by rotating a plane defined by the first and second orthogonal gradients to a corresponding set of prescribed angles.

3. The method as recited in claim 2 which includes:
   g) producing a fiber tracking image from the plurality of magnitude images.

4. The method as recited in claim 3 in which a fiber track is formed in step g) by connecting voxels in the magnitude images having a high magnitude.

5. The method as recited in claim 2 which includes:
   h) repeating steps a) through f) a plurality of times, each repetition employing a two-dimensional diffusion weighting gradient having a different diffusion weighting value b.

6. The method as recited in claim 1 in which one of said orthogonal gradients is produced by a bipolar waveform and the other orthogonal gradient is produced by a waveform having one bipolar waveform followed by an inverted bipolar waveform, and in which the duration of each orthogonal gradient is the same.

* * * * *